United States Patent [19]

Asahi

[11] 4,131,951
[45] Dec. 26, 1978

[54] HIGH SPEED COMPLEMENTARY MOS MEMORY

[75] Inventor: Hiroji Asahi, Zama, Japan

[73] Assignee: Tokyo Shibaura Electric Co., Ltd., Tokyo, Japan

[21] Appl. No.: 797,816

[22] Filed: May 17, 1977

[51] Int. Cl.² .............................................. G11C 11/40
[52] U.S. Cl. .................... 365/203; 307/238; 365/154
[58] Field of Search .................... 340/173 R, 173 FF; 307/238, 279; 365/203, 154

[56] References Cited
U.S. PATENT DOCUMENTS

| | | | |
|---|---|---|---|
| 3,949,382 | 4/1976 | Yasui | 340/173 R |
| 3,978,459 | 8/1976 | Koo | 340/173 R |
| 4,010,453 | 3/1977 | Lewis | 340/173 R |

*Primary Examiner*—Terrell W. Fears
*Attorney, Agent, or Firm*—Finnegan, Henderson, Farabow & Garrett

[57] ABSTRACT

A complementary MOS memory with improved access time is provided with a speed-up signal level changing circuit having two bus lines in which the signal level of the bus line on which a signal level is changing is detected dependent on the signal level difference between the bus lines and the signal level on the bus line with the changing signal level is rapidly changed to the full value of the signal level change, and a switching circuit for coupling the speed-up signal level changing circuit with a reference potential level. In the complementary MOS memory, the signal level appearing on the bus line with the changing signal level is forced to change to be the reference potential level every access cycle, through the operations of the speed-up signal level changing circuit and the switching circuit.

7 Claims, 6 Drawing Figures

HIGH SPEED COMPLEMENTARY MOS MEMORY

BACKGROUND OF THE INVENTION

The present invention relates to a semiconductor memory and, more particularly, a high speed complementary MOS memory in which a signal level change is speeded up on data bus lines.

In a semiconductor memory device, improvement of access time may be attained by speeding up the change of a signal level on a data bus line. In fact, however, circuit elements such as FETs in a memory cell for effecting the signal level change have generally small current capacity and simultaneously the bus line has a parasitic capacitance. For this reason, the signal level appearing on the bus line changes slowly. This has been an obstacle to the improvement of access time in semiconductor memory devices.

SUMMARY OF THE INVENTION

Accordingly, an object of the present invention is to provide a high speed complementary MOS memory in which the level of a signal on the bus lines may be changed more rapidly.

Another object of the present invention is to provide a high speed complementary MOS memory of which the access time is improved by adding a simple circuit.

According to an aspect of the present invention, there is provided a high speed complementary MOS memory comprising: a plurality of memory cells provided between different bus lines and connected to row selection lines, respectively; a precharge circuit connected to the bus lines for precharging the bus lines at the initial level every access cycle; a detector circuit connected to either of the bus lines for detecting the read-out data dependent on the change of the signal level on the bus line connected thereto; a data writing circuit connected to the respective bus lines for supplying the write data to the bus lines to set the voltage level thereon at a predetermined one; a speed-up signal level changing circuit connected between the different bus lines in which the bus line of which the signal level is changing is detected on the basis of the signal level difference between the bus lines with the changed signal level rapidly changed to a reference signal level; and a switching circuit connected to the speed-up signal level changing circuit for coupling the signal level changing circuit to the reference signal level potential.

One of the major features of the invention resides in that the bus line of which the signal level is changing is detected and the signal level on that bus line is forced to change to the predetermined signal level to which the bus line is to be changed and this operation is executed every access cycle.

Other objects and features of the present invention will be apparent from the following description taken in connection with the accompanying drawings, in which:

DETAILED DESCRIPTION OF THE PREFERRED EMBODIMENTS

Figure 1:
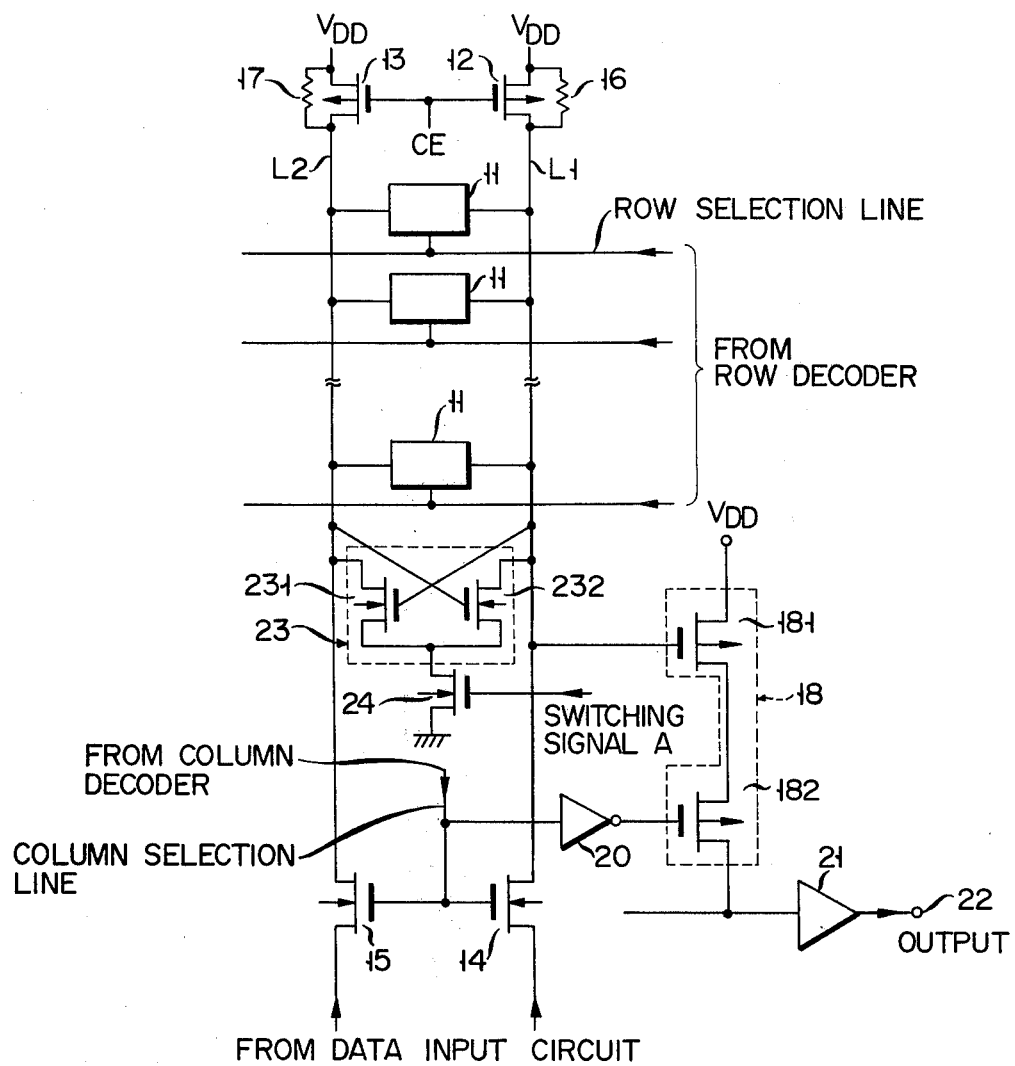
FIG. 1 shows a circuit diagram of a chief portion of an embodiment of a high speed C-MOS memory according to the present invention.

Referring now to FIG. 1, there is shown a part of a high speed C-MOS memory of the invention which is constructed in matrix fashion. In the memory, a data bus line $L_1$ is a data line for reading a signal of, for example, logical level "0" from the semiconductor memory, and another data bus line $L_2$ is a data line for writing a signal of, for example, logical level "1" into the memory. Thus, these data lines $L_1$ and $L_2$ are driven in inverse mode. A plurality of memory cells 11 are connected in parallel between these data lines $L_1$ and $L_2$. One end of each data line $L_1$ and $L_2$ is connected to the corresponding power source $V_{DD}$, through the corresponding P-channel MOS-FETs 12 and 13 for precharging. The other ends of data lines $L_1$, $L_2$ are connected to a data input circuit (not shown) through N-channel MOS-FETs 14 and 15 for data writing. Resistors 16 and 17 are connected in parallel with the P-channel MOS-FETs 12 and 13, respectively, and chip enable signals CE are applied to the gates of the respective MOS-FETs 12 and 13. The resistance values of the resistors 16 and 17 are generally large and each serves to sustain the signal level on the data line of which the signal level is unchanged, at the voltage $V_{DD}$ ("1") of the power source. The precharge circuits 12 and 13 supply precharge signals to data bus lines $L_1$ and $L_2$ to set them at the initial signal level "1", for example. In the FIG. 1 circuit, if the reference potential, e.g. the ground potential, is made to correspond to the logical level "0", the power source voltage $V_{DD}$ which is higher than the ground potential corresponds to the logical level "1".

The output of a column decoder (not shown) is applied to the gates of the respective N-channel MOS-FETs 14 and 15 of the data writing circuit. The memory cells 11 are connected to a row decoder (not shown). A desired memory cell is addressed by the column and row selecting lines. The selected memory cell permits desired data to be written thereinto or read therefrom.

The data bus line $L_1$ is also connected to a level change sensing circuit 18. The level sensing circuit 18 includes a P-channel MOS-FET 181 and another P-channel MOS-FET 182 connected in series thereto. The MOS-FET 181 is connected at the source to the power source $V_{DD}$, at the gate to the bus line $L_1$ and at the drain to the source of the other MOS-FET 182. The MOS-FET 182 is connected at the gate to the output terminal of an inverter 20 connected at the input with the column selection line and at the drain to the output terminal 22 via a buffer 21.

A speed-up signal level changing circuit 23 consists of a flip-flop which comprises N-channel MOS-FETs 231 and 232, is connected between the bus lines $L_1$ and $L_2$. The MOS-FET 231 is connected at the gate to the bus line $L_1$, at the drain to the bus line $L_2$ and at the source to the source of the MOS-FET 232. The MOS-FET 232 is connected at the gate to the bus line $L_2$ and at the drain to the bus line $L_1$. The speed-up signal level changing circuit 23 is connected to the reference potential (e.g. the ground potential) through a switching circuit 24. The switching circuit 24 is comprised of an N-channel MOS-FET whose drain is commonly connected to the sources of the FETs 231 and 232 and the source is grounded. The gate of the FET 24 receives a switching signal A that the chip enable signal CE is delayed with a predetermined time lag.

Figure 2:
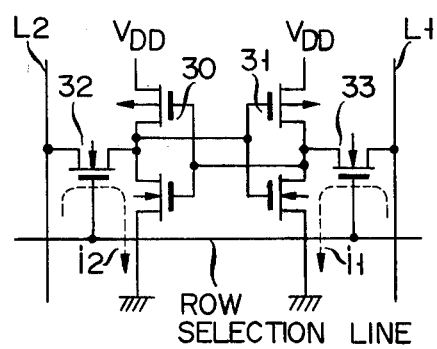
FIG. 2 shows a circuit diagram illustrating the details of memory cell used in the memory shown in FIG. 1.

The detail of the memory cell 11 is shown in FIG. 2. The memory cell employing six MOS transistors of enhancement type is well known. In the memory cell, a pair of complementary MOS transistors (C-MOS) 30 and 31 are connected in parallel between the power source $V_{DD}$ and the ground. Transfer gate MOS transistors 32 and 33 are connected between the C-MOS transistors 30 and 31 and the data lines $L_1$ and $L_2$, respectively. A row selection line is connected to the gates of the MOS transistors 32 and 33. Note that the memory cell 11 may be constructed by the P-channel or N-channel MOS transistors and the number of the MOS transistors is not limited to 6.

Figure 3:
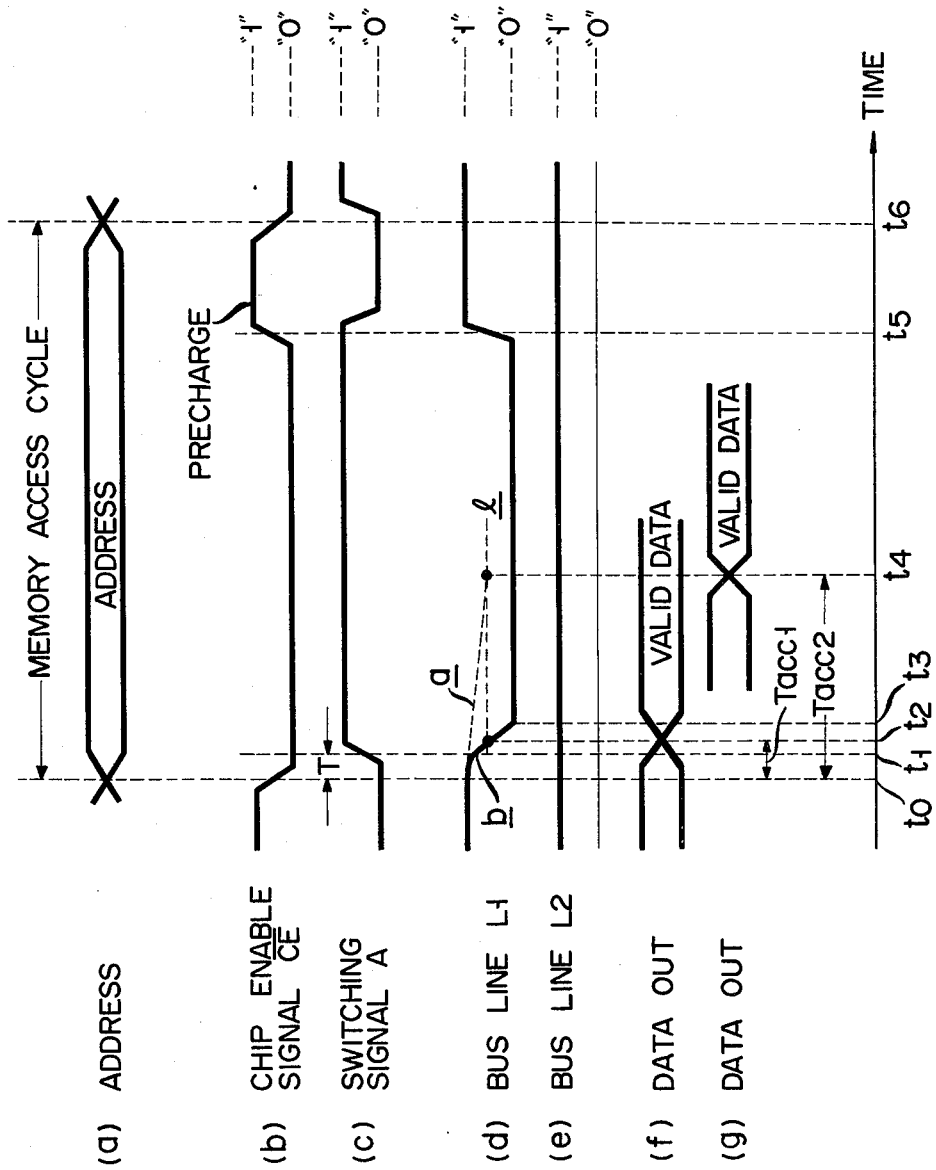
FIG. 3, including a-g, shows a set of timing diagrams for illustrating the operation of the high speed C-MOS memory of the invention.

The operation of the high-speed complementary MOS memory of the invention will be described with reference to FIG. 3. In the figure, the chip enable signal is expressed by the inverted signal $\overline{CE}$. The potential of the power source $+V_{DD}$ is expressed by the logical level "1" and the ground potential by "0".

Let us consider now the case where an addressed one of the memory cells 11 is accessed for reading out a desired data stored therein. Assume now that the voltage levels on the bus lines $L_1$ and $L_2$ are in the initial level "1", as shown in FIGS. 3(d) and (e). Then, an address information is applied to the row and column selection lines for addressing a desired memory cell 11. In the memory cell, charges in the MOS-FET are discharged through the paths indicated by arrows $i_1$ and $i_2$. When charges start to discharge through the path $i_1$ in the memory cell, the voltage level of the bus line $L_1$ starts to drop, as shown in FIG. 3(d). The FET 181 of the sensing circuit 18 detects the change of the signal level on the bus line $L_1$. The signal level change detected is fed to the buffer 21 through the FET 182 which is conductive in response to the address signal from the column selection line. When the gate potentials of the FETs 231 and 232 grow enough to drive the flip-flop 23 and to make the flip-flop 23 stable in the proper state of operation, then the switching FET 24 is made conductive by the switching signal A. At this time, if the FET 232 of the flip-flop 23 is in ON condition, the FET 231 is in OFF condition. Conversely, if the FET 231 is in ON condition, the FET 232 is in OFF condition. The switch signal A is formed by inverting the chip enable signal $\overline{CE}$ (FIG. 3(b)) and delaying it by a predetermined time as shown in FIG. 3(c). The delay time T must be optimum. Preferably, the delay time T is the time necessary for the gate potentials of the FETs 231 and 232 to reach a potential sufficient to reverse the correct state of the flip-flop 23 until the switching FET 24 is turned on. After the delay time T, i.e. at the time $t_1$, the switch signal A is applied to the switching FET 24 which in turn is turned on. As a consequence, the voltage level of signal on the bus line $L_1$ is coupled to ground after passing through the FET 231 of the flip-flop 23 and the switching FET 24. Therefore, the potential level on the bus line $L_1$ gradually diminishes along a gentle slope as shown in a line a of FIG. 3(d) during the period of time $t_0$ to $t_1$, and, at time $t_2$, the potential level abruptly diminishes in a sharp slope, as shown in a line b of FIG. 3(d).

The potential level on the bus line $L_1$ reaches the voltage sense level 1 at time $t_2$. The voltage sense level 1 indicates the voltage level permitting the sensing circuit 18 to detect the data. Accordingly, when the potential level on the bus line $L_1$ reaches the level 1, the FET 181 of the sensing circuit 18 is conductive and the data read out of the memory cell addressed are fed to the buffer 21, through the FETs 181 and 182 of the sensing circuit 18, and then is outputted from the output terminal 22.

The voltage level on the bus line $L_1$, at time $t_1$, becomes the ground potential ("0"). The data read out of the memory cell 11 via the bus line $L_1$ becomes the valid data at time $t_2$, as shown in FIG. 3(g), and is outputted from the output terminal 22. This means that the access time Tacc1 of the semiconductor memory of the invention is a short period of time from $t_0$ to $t_1$.

The data is read out of the memory cell 11 until time $t_5$. The chip enable signal $\overline{CE}$ changes from "0" to "1" level at time $t_5$. Upon the change of the signal level of the chip enable signal $\overline{CE}$, the signal level of the switching signal A changes from "1" to "0", as shown in FIG. 3(c). The change of the signal level causes the switching FET 24 to be in the OFF condition. At this time, since the chip enable signal $\overline{CE}$ is "0" level, the inverted signal CE assumes a "1" level. The signal CE of "1" is applied to the gates of the FETs 13 and 12 at the precharge portion. The FETs 12 and 13 for precharge, therefore, are turned on and the power source $V_{DD}$ appears on the bus lines $L_1$ and $L_2$. In other words, the precharge signal of "1" level as shown in FIG. 3 causes the signal level on each bus line $L_1$ and $L_2$ to be the initial level "1" (FIGS. 3(d) and (e)).

At time $t_6$, the memory access cycle is completed and the succeeding memory access cycle will be repeated in the semiconductor memory. When data is written into the memory cell 11 in the ensuing memory access cycle, data is loaded from an input circuit into the memory cell addressed. In other words, the data to be loaded are supplied to the FETs 14 and 15 for data writing and an address signal is supplied from the column selection line to the gates, thus resulting in conduction of the FETs 14 and 15. Through the conduction of the FETs 14 and 15, the signal level "1" at the initial level on each bus line $L_1$ and $L_2$ changes to "0" level so that data is loaded into the memory cell 11 addressed. In this case, current flows through the path $i_2$ in the memory cell of FIG. 2 and the signal level on the bus line $L_2$ is rapidly changed from "1" to "0" level by the speed-up signal level changing circuit 23 and the switching circuit 24.

Reference will again be made to FIG. 3. In the semiconductor memory of the invention, the signal level is forced to change from "high" to "low" so that the access time is very short. Unless the speed-up signal level changing circuit is used, the signal level on the bus line $L_1$ changes in a gentle slope as indicated by the line a. For this, the signal level on the bus line $L_1$ reaches at time $t_4$ the voltage sense level 1 at which the sensing circuit 18 can detect data. Accordingly, the data read from the memory cell 11 is the valid data as shown in FIG. 3. At this time, the access time Tacc2 is the time period from $t_0$ to $t_4$, which is long compared to the memory access time Tacc1 of the present invention. In fact, the access time Tacc1 of the memory of the invention is 50 ns to 60 ns shorter than the access time Tacc2 of the conventional memory.

Figure 4:
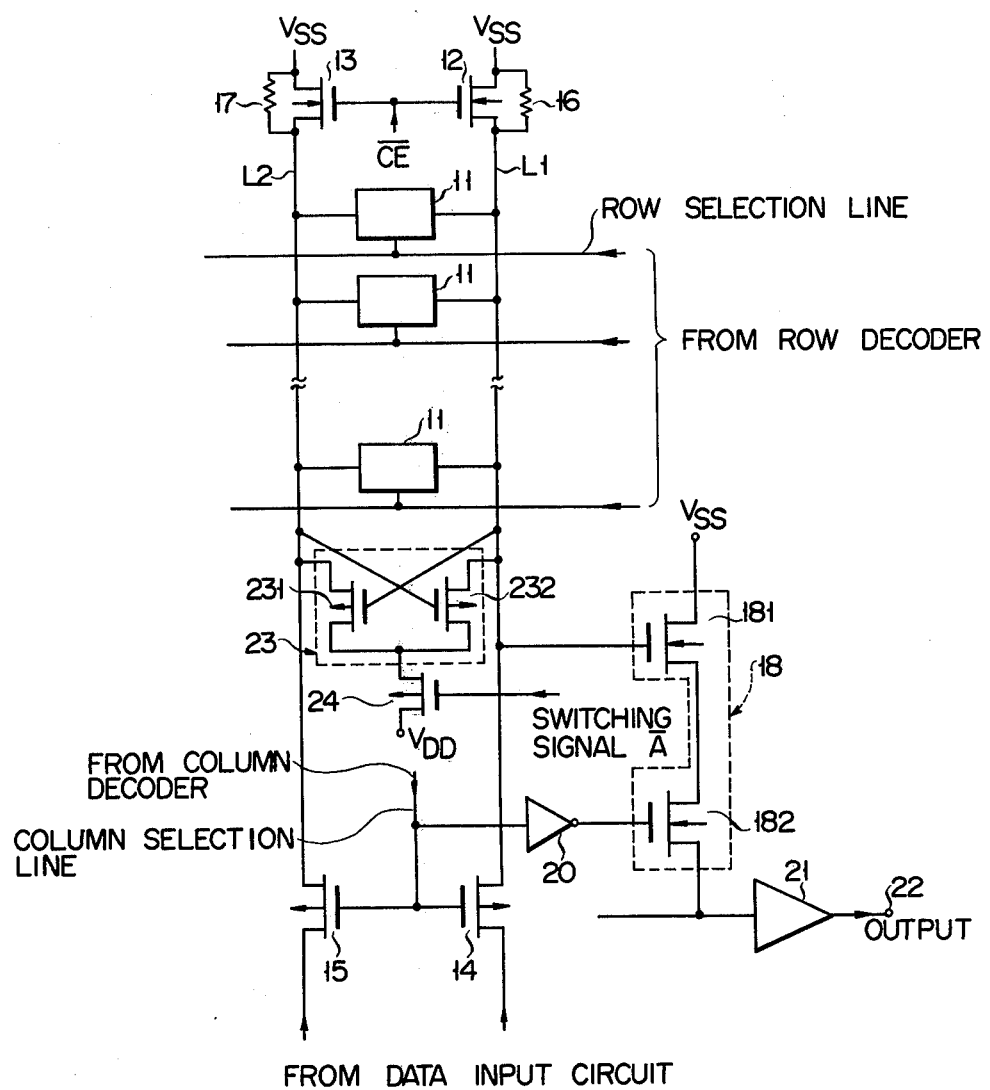
FIG. 4 shows a modification of the memory shown in FIG. 1 in which the MOS transistors used in the FIG. 1 memory are used in inverse polarity mode.

Turning now to FIG. 4, there is shown another embodiment of the semiconductor memory device according to the present invention in which the transistors used therein are the MOS transistors with the polarity inverse to that of the MOS transistors used in the FIG. 1 memory. More exactly, P-channel MOS transistors are used for the MOS-FETs in the speed-up signal level changing circuit 23, the switching circuit 24, and the data writing circuits 14 and 15, and N-channel MOS transistors are used for MOS-FETs in the precharge circuits 12 and 13 and the sensing circuit 18. In this case, a power source $V_{SS}$ is supplied to the source of the MOS-FET of the switching circuit 24 and the switching signal $\overline{A}$ which is the inverted one of the signal A is applied to the gate of the MOS-FET. The MOS-FETs 12 and 13 of the precharge circuit are connected at the sources to the power source and coupled at the gates with the chip enable signals $\overline{CE}$. Accordingly, the data bus lines $L_1$ and $L_2$ are precharged by the power source $V_{SS}$ ($V_{DD} > V_{SS}$ and $V_{SS}$ corresponds to the ground level of "0"), and thus the initial level of the FIG. 4 memory is "0". Unlike the FIG. 1 memory, the signal level changing of the FIG. 4 memory is performed from "1" to "0" level. The changing operation of the signal level is performed in the same manner as in the previous case, and, therefore, description thereof will be omitted here.

Figure 5:
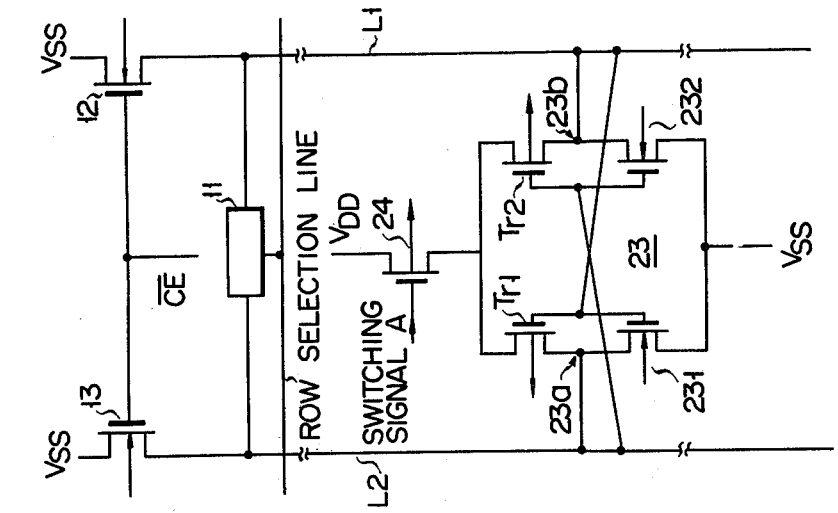
FIG. 5 shows a circuit diagram of a part of another modification of the high speed C-MOS memory according to the present invention.

FIG. 5 shows another example of the speed-up signal level changing circuit 23 in which the complementary MOS (C-MOS) circuit is used. That is, the first C-MOS circuit 23a and the second C-MOS circuit 23b cooperate to form a flip-flop circuit. In this case, the resistors 16 and 17 used in the FIG. 1 memory are unnecessary. The reason for this is that the MOS transistors Tr1 and Tr2 in the C-MOS circuit serve as the resistors 16 and 17. The remaining portion of the circuit is the same as of the FIG. 1 circuit and hence is not illustrated. The power source $V_{DD}$ is supplied to the drains of the MOS transistors Tr1 and Tr2.

In this memory circuit, let us consider the case where the voltage level on the bus line $L_1$ changes from "1" to "0" and that on the bus line $L_2$ does not change substantially. In fact, the voltage level on the bus line $L_2$ slightly drops and then returns the "1" level. The returning speed is quick since the MOS transistors Tr1 and Tr2 are used in place of the resistors 16 and 17 of the FIG. 1 circuit. Therefore, the signal level difference between the bus lines $L_1$ and $L_2$ may be swiftly detected (this means that the time T of FIG. 3 is shortened) and thus the memory access time of FIG. 4 memory may be shorter than that of the FIG. 1 memory. Further, since the resistors 16 and 17 are omitted, the power consumption in the memory circuit may be reduced compared with the FIG. 1 memory.

Figure 6:
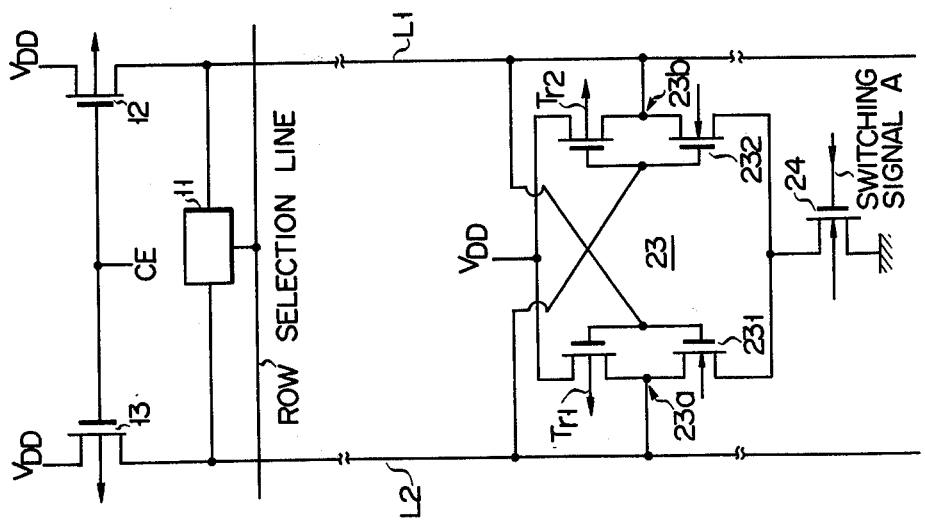
FIG. 6 shows a modification of the FIG. 5 circuit in which the MOS transistors used in the FIG. 5 memory circuit are used in inverse polarity mode.

FIG. 6 shows an example of the memory using MOS transistors with polarity inverse to that of those used in the FIG. 5 memory circuit. In this case, the operation and effects attained are similar to the FIG. 5 ones.

While the present invention, as to objects and advantages, has been described herein as carried out in a specific embodiment thereof, it is not limited thereby but it is intended to cover the invention broadly within the spirit and scope of the appended claims.

What is claimed is:

1. A high speed complementary MOS memory comprising:
    first and second data bus lines and row selection lines;
    a plurality of memory cells provided between said first and second data bus lines and connected to said row selection lines;
    precharge means connected to said first and second bus lines for precharging said bus lines to an initial level every access cycle, said precharge means including resistive means tending to maintain said bus lines at said initial level;
    sensing means connected to one of said bus lines for detecting read out data dependent on a change of the signal level on the bus line connected thereto;
    data writing means connected to said bus lines for supplying write data to said bus lines to set the voltage level thereon to a predetermined level;
    speed-up signal level changing means connected between said first and second bus lines for detecting signal level change in either bus line on the basis of a signal level difference between said bus lines and for rapidly changing the signal level on the bus lines on which a signal level change is detected to a reference signal level potential; and
    switching means connected to said speed-up signal level changing means for coupling said signal level changing means to said reference signal level potential.

2. A high speed complementary MOS memory according to claim 1 in which said data writing means comprises MOS-FETs of specific channel type of which the gates are commonly connected to a column selection line, and these MOS-FETs are conductive when the memory is addressed and permit at this time given write data fed from a data input circuit to be supplied to said bus lines.

3. A high speed complementary MOS memory according to claim 1, in which said precharge means comprises first and second MOS-FETs of specific channel type operating in response to a chip enable signal and said resistive means includes first and second resistors with given values of resistrance sufficient to sustain said initial level in said bus lines, these first and second resistors being connected in parallel respectively to said first and second MOS-FETs.

4. A high speed complementary MOS memory according to claim 1, in which said speed-up signal level changing means comprises a flip-flop circuit including first and second MOS-FETs of a given channel type, the gates of said first and second MOS-FETs being cross-connected to said bus lines, said flip-flop circuit being rapidly set in a predetermined conduction state in response to a change of the signal level on one of said bus lines.

5. A high speed complementary MOS memory according to claim 1, in which said switching means comprises a MOS-FET of given channel type which is conductive when the gate of said MOS-FET receives a switch signal delayed until the signal level on said bus lines reaches the potential level enough to stably drive said speed-up signal level changing means.

6. A high speed complementary MOS memory according to claim 1, in which said sensing means includes first and second MOS-FETs connected to each other in series fashion, the gate of said first MOS-FET being connected to one of said bus lines while the gate of said second MOS-FET being connected to the column selection line, and said sensing means detects the data read out of the memory cell located at a given address.

7. A high speed complementary MOS memory according to claim 1, in which said signal level changing means is a flip-flop comprising first and second complementary MOS circuits of given channel type, and said precharge means comprises MOS-FETs of given channel type operating in response to a chip enable signal.

* * * * *

UNITED STATES PATENT OFFICE
CERTIFICATE OF CORRECTION

Patent No. 4,131,951         Dated December 26, 1978

Inventor(s)    HIROJI ASAHI

It is certified that error appears in the above-identified patent and that said Letters Patent are hereby corrected as shown below:

In the Abstract, line 12, delete "be".

Signed and Sealed this

Third Day of July 1979

[SEAL]

*Attest:*

*Attesting Officer*

LUTRELLE F. PARKER
*Acting Commissioner of Patents and Trademarks*

UNITED STATES PATENT AND TRADEMARK OFFICE
CERTIFICATE OF CORRECTION

PATENT NO. : 4,131,951
DATED : December 26, 1978
INVENTOR(S) : HIROJI ASAHI

It is certified that error appears in the above–identified patent and that said Letters Patent are hereby corrected as shown below:

All foreign application priority data was omitted from original Letters Patent. Should read --

May 17, 1976     Japan     51-56246

Signed and Sealed this

Twenty-seventh Day of November 1979

[SEAL]

Attest:

RUTH C. MASON
Attesting Officer

LUTRELLE F. PARKER
Acting Commissioner of Patents and Trademarks